(12) United States Patent
Shu et al.

(10) Patent No.: US 7,292,490 B1
(45) Date of Patent: Nov. 6, 2007

(54) SYSTEM AND METHOD FOR REFRESHING A DRAM DEVICE

(75) Inventors: Lee-Lean Shu, Los Altos, CA (US); Stephen Lee, Campbell, CA (US)

(73) Assignee: GSI Technology, Inc., Santa Clara, CA (US)

( * ) Notice: Subject to any disclaimer, the term of this patent is extended or adjusted under 35 U.S.C. 154(b) by 18 days.

(21) Appl. No.: 11/223,194

(22) Filed: Sep. 8, 2005

(51) Int. Cl.
   *G11C 7/00* (2006.01)
(52) U.S. Cl. ........................... 365/222; 365/233
(58) Field of Classification Search ............... 365/222
   See application file for complete search history.

(56) References Cited

U.S. PATENT DOCUMENTS 5,193,072 A   3/1993   Frenkil et al.
5,835,401 A   11/1998  Green et al.
6,646,944 B2 * 11/2003  Shimano et al. ............ 365/222
2005/0052928 A1 * 3/2005  Koshikawa .................. 365/222

* cited by examiner

*Primary Examiner*—Kretelia Graham
(74) *Attorney, Agent, or Firm*—DLA Piper US LLP (57) ABSTRACT

The present invention provides a system and method for refreshing a DRAM device without interrupting or inhibiting read and write operations of the DRAM device. The system may includes refresh control circuitry that selectively generates requests to perform refresh operations and a refresh address counter that is coupled to the refresh control circuitry and that generates a refresh address in response to receiving a refresh request. The refresh address corresponds to a word line of the DRAM array to be refreshed. Address control and switching circuitry may be coupled to the refresh control circuitry. The address control and switching circuitry selectively transmits read/write addresses and refresh addresses to the DRAM array, in order to perform refresh operations on the DRAM array without inhibiting read and write operations.

24 Claims, 13 Drawing Sheets

SYSTEM AND METHOD FOR REFRESHING A DRAM DEVICE

FIELD OF THE INVENTION

The present invention generally relates to semiconductor memory devices, such as dynamic random access memory ("DRAM") devices. More particularly, the present invention relates to system and method for refreshing a DRAM device without interrupting or inhibiting read or write operations on the DRAM device.

BACKGROUND OF THE INVENTION

Figure 1:
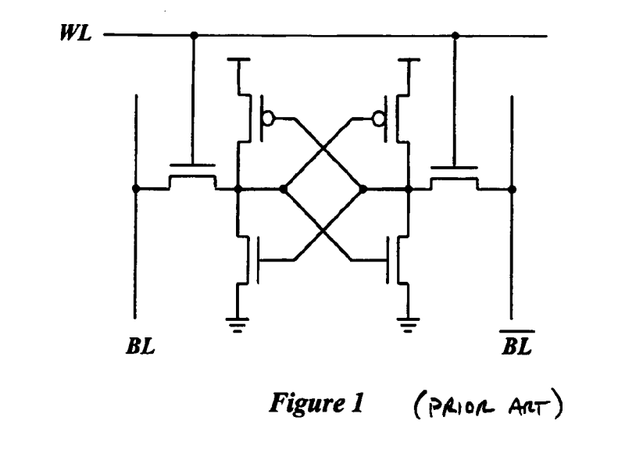
FIG. 1 is a schematic diagram of a six transistor (6T) SRAM cell, according to the prior art.
Figure 2:
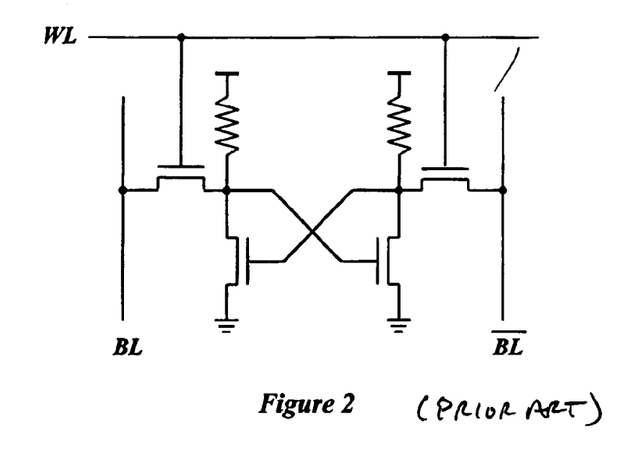
FIG. 2 is a schematic diagram of a four transistor (4T) SRAM cell, according to the prior art.

Semiconductor memory devices are used to store electronic data. One type of semiconductor memory devices is a static random access memory device or an "SRAM" device. An SRAM device typically uses several transistors within each memory cell of the device to store electronic data. FIGS. 1 and 2 illustrate examples of prior art SRAM cells including six transistors and four transistors, respectively. SRAM devices have the benefit of not requiring any refresh cycles to maintain stored data. On the other hand, SRAM memory cells typically include a larger number transistors which increases the cost and size of these semiconductor memory devices relative to other types of devices.

Figure 3:
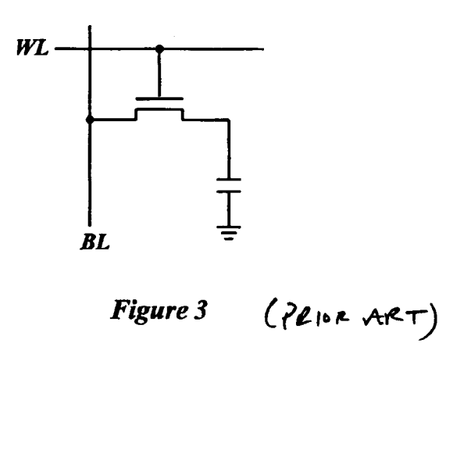
FIG. 3 is a schematic diagram of a one transistor (1T) DRAM cell, according to the prior art.
Figure 4:
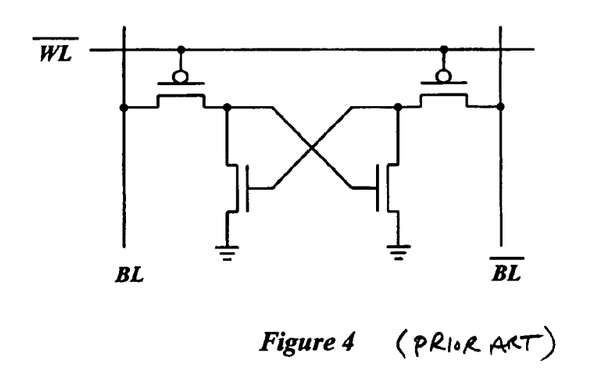
FIGS. 4-7 are schematic diagrams of four transistor (4T) DRAM cells, according to the prior art.
Figure 5:
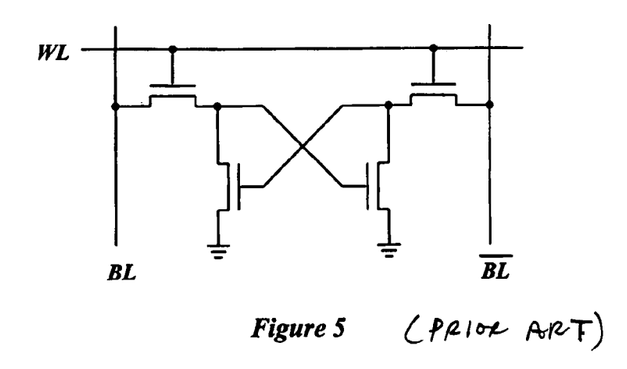
Figure 6:
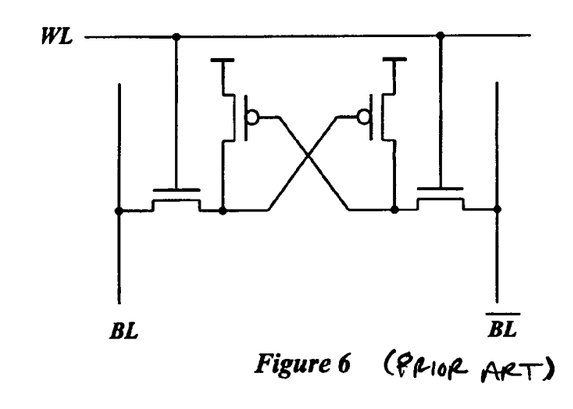
Figure 7:
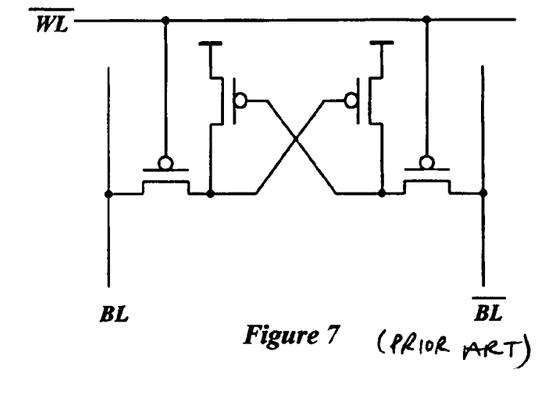

Another type of semiconductor memory device is a dynamic random access memory device or a "DRAM" device. A DRAM device typically includes fewer transistors than an SRAM device, and one or more capacitors within each memory cell of the device to store electronic data. Because DRAM devices use capacitors for storage, DRAM devices require periodic refreshing in order to maintain stored data. FIG. 3 illustrates a one transistor (1T) DRAM cell. The 1T cell may be refreshed by reading the cell first and then writing back its data to the cell.

FIGS. 4-7 illustrate examples of four transistor (4T) DRAM cells, which also require refreshing. The 4T DRAM cells are sometimes referred as "quasi-static" cells. A 4T cell may be refreshed simply by turning on the word line for a short period of time, provided that both bitlines have been charged up to logic 1. Some merits of a 4T DRAM cell include: (i) it is smaller in size compared to 6T static cell, which allows higher density; (ii) it offers better access speed and cell stability than a 1T DRAM cell; and (iii) it is simple to refresh.

The present invention provides a system and method for refreshing a DRAM device, such as a device including 4T DRAM cells, in a manner that does not interrupt or inhibit read and write operations.

SUMMARY OF THE INVENTION

The present invention provides system and method for refreshing a DRAM device without interrupting or inhibiting read and write operations of the DRAM device. According to one aspect of the present invention, the system includes refresh control circuitry that selectively generates requests to perform refresh operations; a refresh address counter that is coupled to the refresh control circuitry and that generates a refresh address in response to receiving a refresh request, the refresh address corresponding to a word line of the DRAM array to be refreshed; and address control and switching circuitry coupled to the refresh control circuitry. The address control and switching circuitry selectively transmits read/write addresses and refresh addresses to the DRAM array, in order to perform refresh operations on the DRAM array without inhibiting read and write operations.

According to another aspect of the present invention, a method for refreshing a DRAM array is provided. The method includes generating refresh requests; generating a refresh address in response to a refresh request, the refresh address corresponding to a word line of the DRAM array to be refreshed; and selectively transmitting read/write addresses and refresh addresses to the DRAM array, in order to perform refresh operations on the DRAM array without inhibiting read and write operations.

These and other features, advantages, and objects of the invention will become apparent by reference to the following specification and drawings.

DETAILED DESCRIPTION OF THE INVENTION

The present invention is now described in detail with reference to the drawings, which are provided as illustrative examples of the invention so as to enable those skilled in the art to practice the invention. Notably, the implementation of certain elements of the present invention may be accomplished using software, hardware, firmware or any combination thereof, as would be apparent to those of ordinary skill in the art, and the figures and examples below are not meant to limit the scope of the present invention. Moreover, where certain elements of the present invention can be partially or fully implemented using known components, only those portions of such known components that are necessary for an understanding of the present invention will be described, and detailed descriptions of other portions of such known components will be omitted so as not to obscure the invention.

Figure 8:
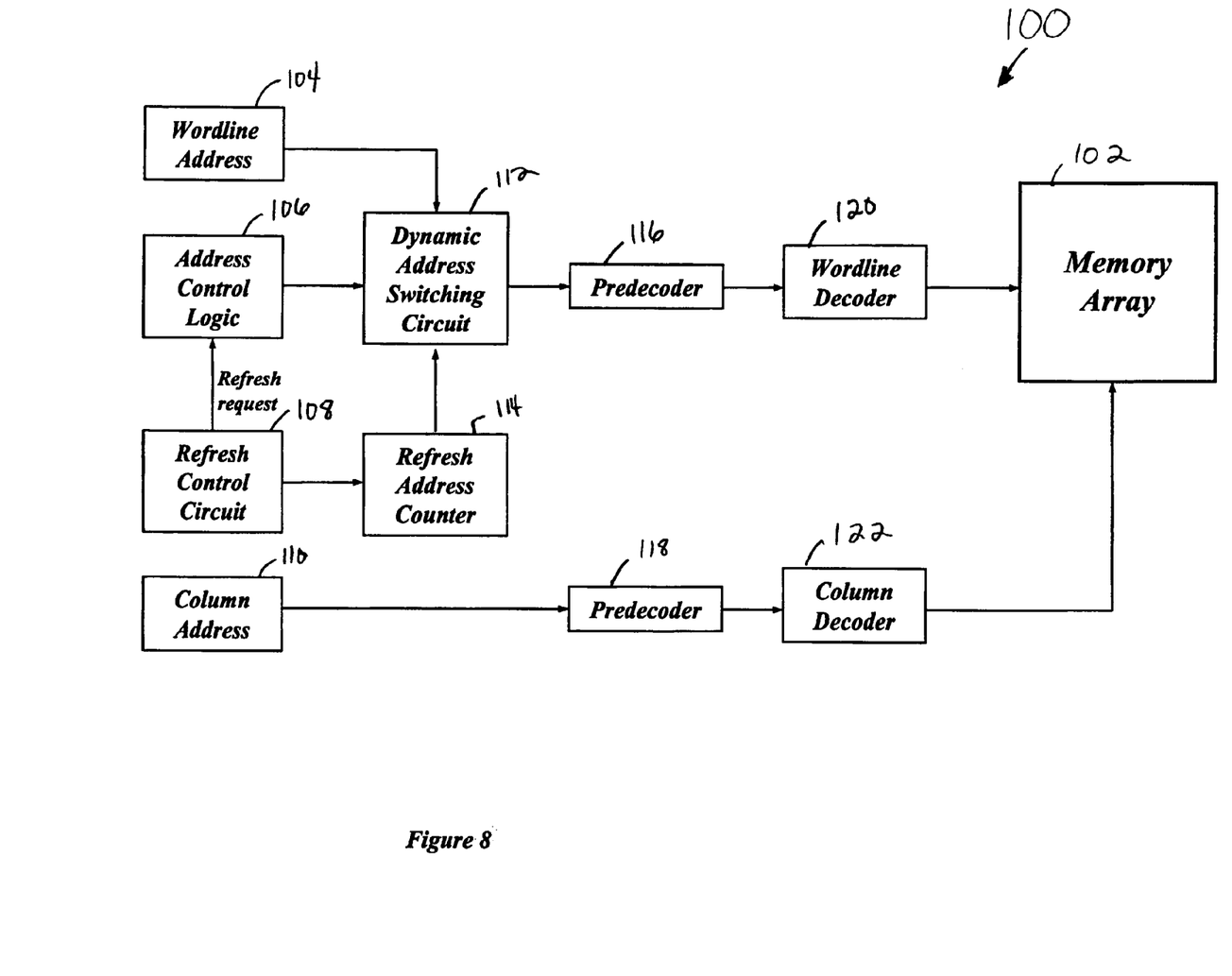
FIG. 8 is a block diagram of one embodiment of a system and method for refreshing a DRAM device, according to the present invention.

FIG. 8 is a high level block diagram of one embodiment of a system 100 for refreshing a DRAM device without interrupting or inhibiting read/write operations, according to the present invention. While the following discussion relates to a system 100, it should be appreciated that each of the portions or blocks illustrated in FIG. 8 (as well as the other Figures) may represent logic steps or processes performed according to an inventive method. Conventional hardware, software and/or firmware may be used to perform the logic steps and/or processes. It should further be appreciated that such logic steps or processes can be implemented as computer-executable instructions stored on a computer readable medium.

System 100 may include word line address generating circuitry 104, address control logic 106, refresh address control circuit 108, refresh address counter 114 and dynamic address switching circuitry 112. Word line address generating circuitry 104, address control logic 106 and refresh address counter 114 are communicatively coupled to dynamic address switching circuitry 112. Refresh control circuit 108 is communicatively coupled to address control logic 106 and refresh address counter 114. Dynamic address switching circuitry 112 is coupled to a predecoder 116 and to a word line decoder 120, which is coupled to DRAM memory array 102. System 100 further includes column address generating circuitry 110, a predecoder 118, and a column decoder 122. Column address generating circuitry 110 is coupled to predecoder 118, which is coupled to column decoder 122. Column decoder 122 is coupled to memory array 102. Word line decoder 120 and column decoder 122 collectively provide address information to memory array 102 in a conventional manner.

The refresh circuitry of the present invention, which may include refresh control circuit 108 and refresh address counter 114, may act as an independent unit to DRAM array 102. In operation, refresh control circuit 108 selectively transmits refresh requests to address control logic 106 request refresh operations and to synchronize with the normal read and write operations of the DRAM array 102. System 100 executes a refresh operation by activating the word line that is decoded from the refresh address generation circuitry 108. All the cells that are connected to the activated word line are refreshed. The address control logic 106 may receive refresh requests from the refresh control circuit 108 and determine when to send a refresh address to memory array 102. The address control logic 106 causes dynamic address switching circuit 112 to selectively transmit the read/write addresses from word line address generating circuitry 104 and refresh addresses from refresh address counter 114.

In one embodiment, the address control logic 106 has three states: normal mode, refresh mode and power-down mode, which are based on the operations status of the DRAM array 102 and status of the refresh pulse. "Normal mode" is when the DRAM array 102 is in either read mode or write mode. When the address control logic 106 is in normal mode, it sends an external address to the word line decoder (e.g., via circuit 112). The column decoder 122 also receives an external address, which is used in conjunction with the word line decoder to select a particular DRAM cell in array 102. "Refresh mode" is when the DRAM array 102 is not in normal mode operation and a refresh pulse, which may be generated by refresh control circuit 108, is active. When the system is in refresh mode, address control logic 106 sends a refresh address from refresh address counter 114 to the word line decoder 120 (e.g., via circuit 112). The corresponding word line is then activated in memory array 102 to refresh all the cells connected to that word line. "Power down mode" is when the DRAM array 102 is in neither normal mode nor refresh mode. All three modes can occur in one cycle time in a synchronous memory device due to dynamic pulse design. But the modes will not occur simultaneously because normal mode takes precedence over refresh mode. Once normal mode operation is completed, the refresh mode can take place if there is refresh pulse present otherwise the address control logic would settle into power-down mode. It is possible for the system to go into normal mode when a refresh operation is still in progress. In this case, refresh mode operation will be terminated immediately and unconditionally.

In order to ensure a proper refresh completion, the width of a refresh pulse may be selected to be longer than the time it takes to complete the normal operation to ensure a proper refresh completion. In one embodiment, the refresh pulse is selected to be equal to or wider than the sum of normal operation time plus twice the time required for a word line refresh or the refresh word line pulse (e.g., refresh pulse$\geq$active enable pulse width+2×refresh word line pulse width). One skilled in the art will appreciate that a pulse of this size will guarantee successful refresh under any situations. Once a refresh pulse is completed, the refresh operation is stopped until next refresh request.

The present invention can be applied to synchronous and asynchronous DRAM devices. Furthermore, the present invention can be applied to any type of DRAM cell array that requires refreshing. A DRAM device employing the hidden refresh strategy of the present invention can perform substantially the same as an SRAM device.

Figure 9:
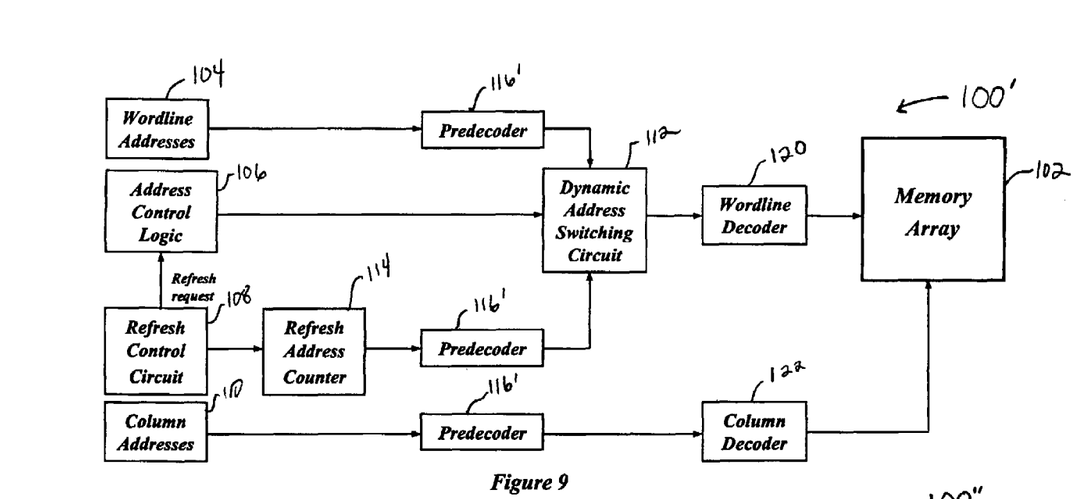
FIG. 9 is block diagram of another embodiment of a system and method for refreshing a DRAM device, according to the present invention.
Figure 10:
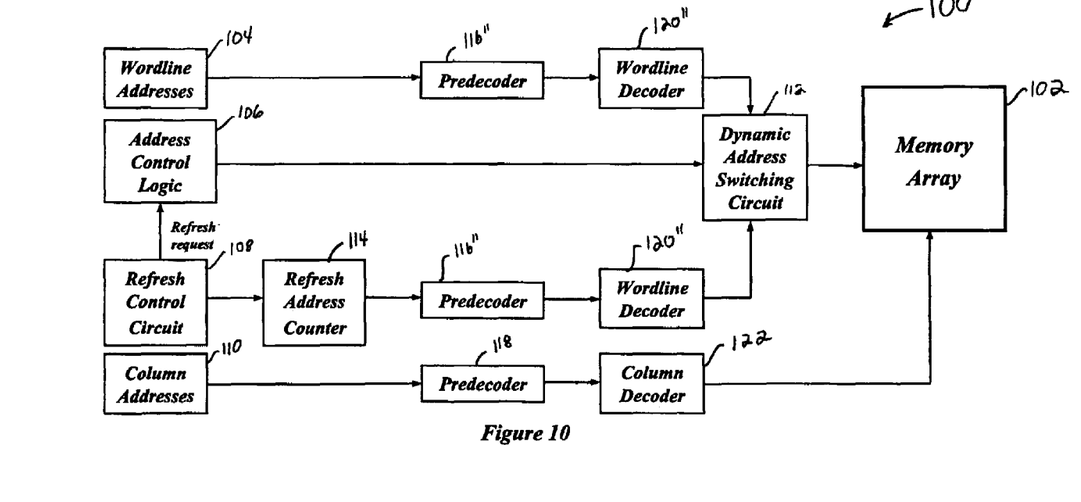
FIG. 10 is block diagram of another embodiment of a system and method for refreshing a DRAM device, according to the present invention.

FIGS. 9 and 10 are high level block diagrams of memory systems employing two alternate embodiments of the invention. FIG. 9 illustrates a memory system 100' for refreshing DRAM array 102. The components of system 100' are substantially similar in function and structure to the components of system 100 of FIG. 8, with like numerals referring to like elements. The primary difference between system 100' and system 100 is that the address is switched (i.e., between a read/write address from word line address generating circuitry 104 and a refresh address from refresh address counter 114) after the address has been predecoded by predecoder circuitry 116'.

FIG. 10 illustrates a system 100" for refreshing DRAM array 102. The components of system 100" are substantially similar in function and structure to the components of system 100 of FIG. 8, with like numerals referring to like elements. The primary difference between system 100" and system 100 is that the address is switched (i.e., between a read/write address from word line address generating circuitry 104 and a refresh address from refresh address counter 114) after the word line and refresh addresses have been predecoded by predecoder circuitry 116" and decoded by word line decoder circuitry 120".

Figure 11:
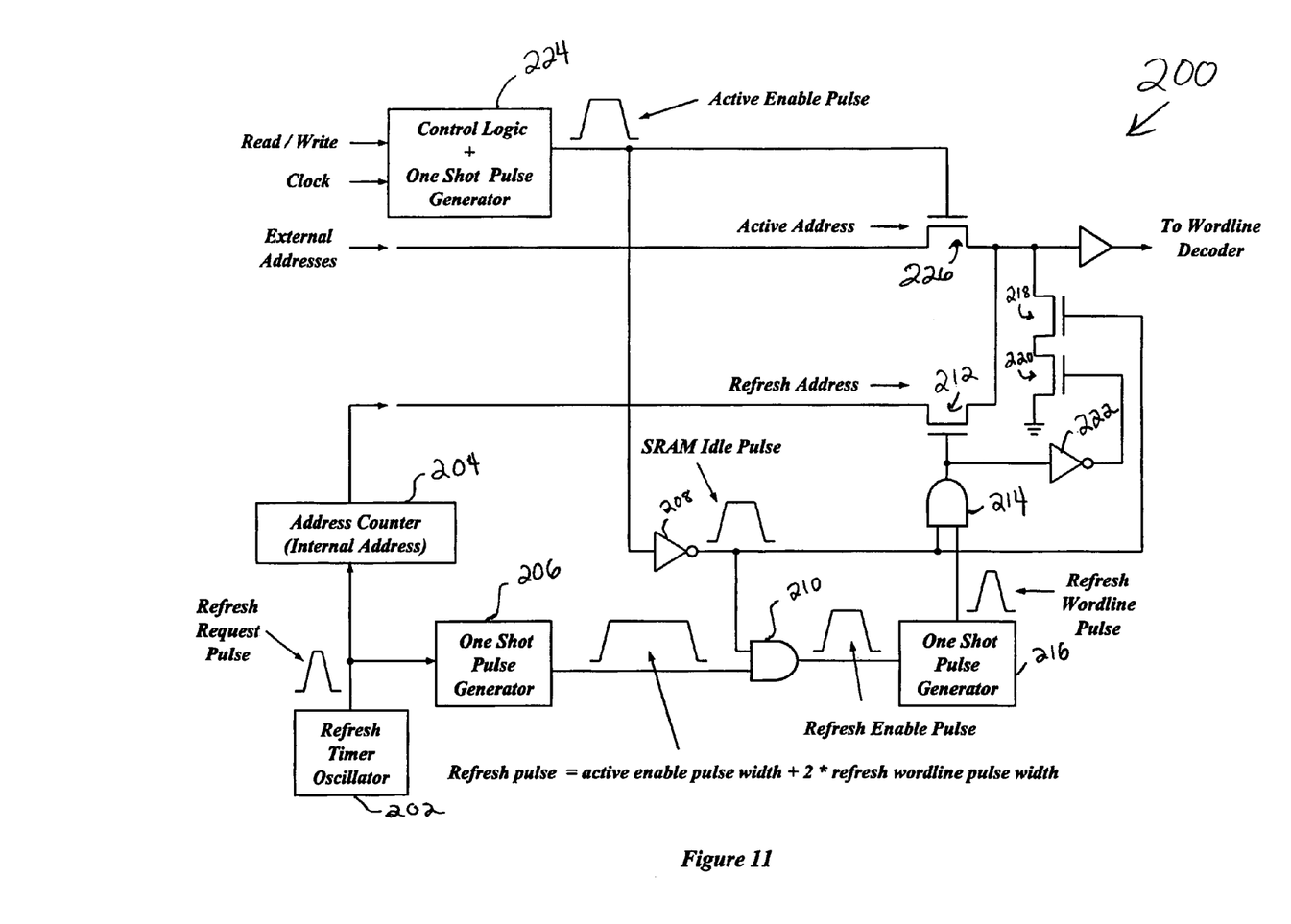
FIG. 11 is a schematic diagram of one embodiment of a synchronous circuit for refreshing a DRAM array, according to the present invention.
Figure 12:
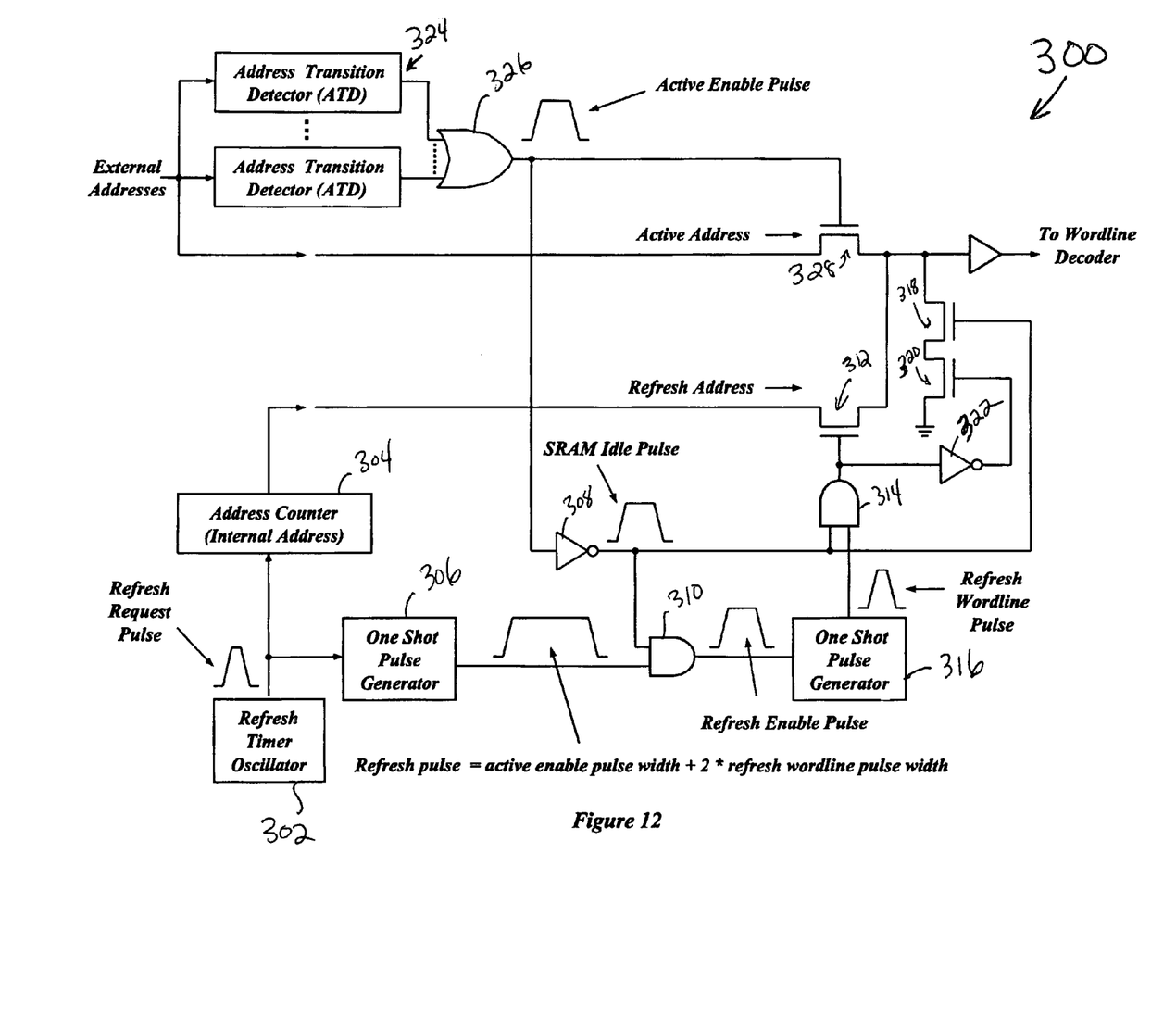
FIG. 12 is a schematic diagram of one embodiment of an asynchronous circuit for refreshing a DRAM array, according to the present invention.
Figure 13:
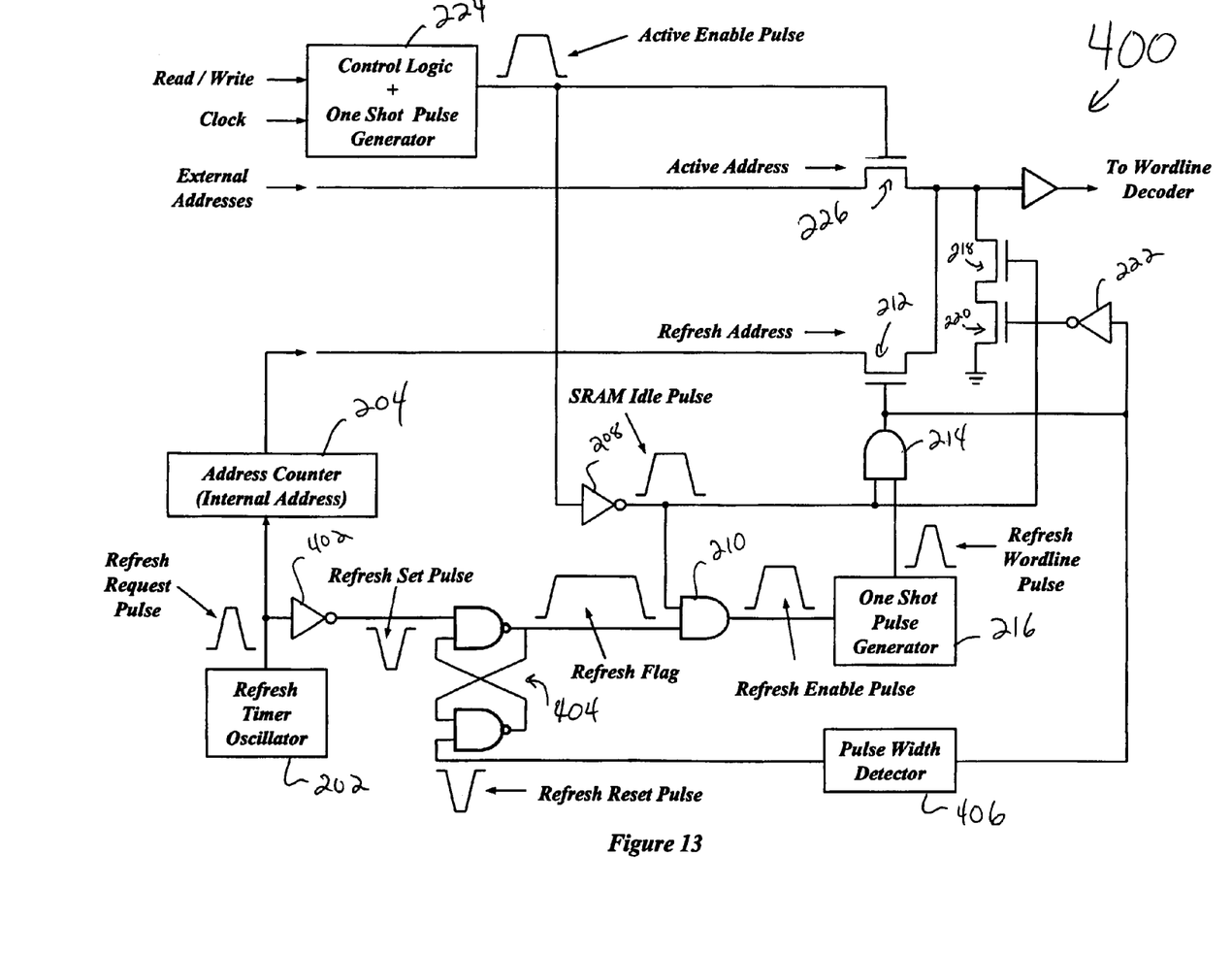
FIG. 13 is a schematic diagram of another embodiment of a synchronous circuit for refreshing a DRAM array, according to the present invention.

FIGS. 11, 12 and 13 illustrate schematic diagrams of particular embodiments of refresh circuits, according to the present invention. FIG. 11 is a schematic diagram of one embodiment of a synchronous refresh memory circuit 200, according to the present invention. Refresh circuit 200 may include a refresh timer oscillator 202, address counter 204, one shot pulse generators 206 and 216, AND gates 210, 214, inverters 208 and 222, transistors 212, 218, 220 and 226, and control logic and one shot pulse generator 224. Refresh timer oscillator 202 is coupled to address counter 204. Address counter 204 is coupled to transistor 212, which may be selectively activated to provide refresh addresses to the to the DRAM device (e.g., via the word line decoder). Refresh timer 202 is further coupled to one shot pulse generator 206, which is coupled to one of the inputs of AND gate 210. The other input of AND gate 210 is coupled to inverter 208, which is coupled to the output of control logic 224. The output of AND gate 210 is coupled to one shot pulse generator 216, which is coupled to an input of AND gate 214. The other input of AND gate 214 is coupled to the output of inverter 208, which is also coupled to the gate of transistor 218. The output of AND gate 214 is coupled to the gate of transistor 212 and to the input of inverter 222, which is coupled to the gate of transistor 220.

Address counter 204 may include one or more conventional counting devices such as a ring counter, shift-registers or the like. The refresh timer oscillator 202 controls the rate of refresh. Particularly, the refresh timer oscillator 202 generates a asynchronous refresh request pulse with which a refresh pulse is generated. The request pulse will cause address counter to count up or down to generate a new refresh address. In one embodiment, the refresh timer may control the rate of refresh by monitoring parameters of the DRAM device, such as cell leakage and temperature to adjust the refresh rate accordingly.

Figure 19:
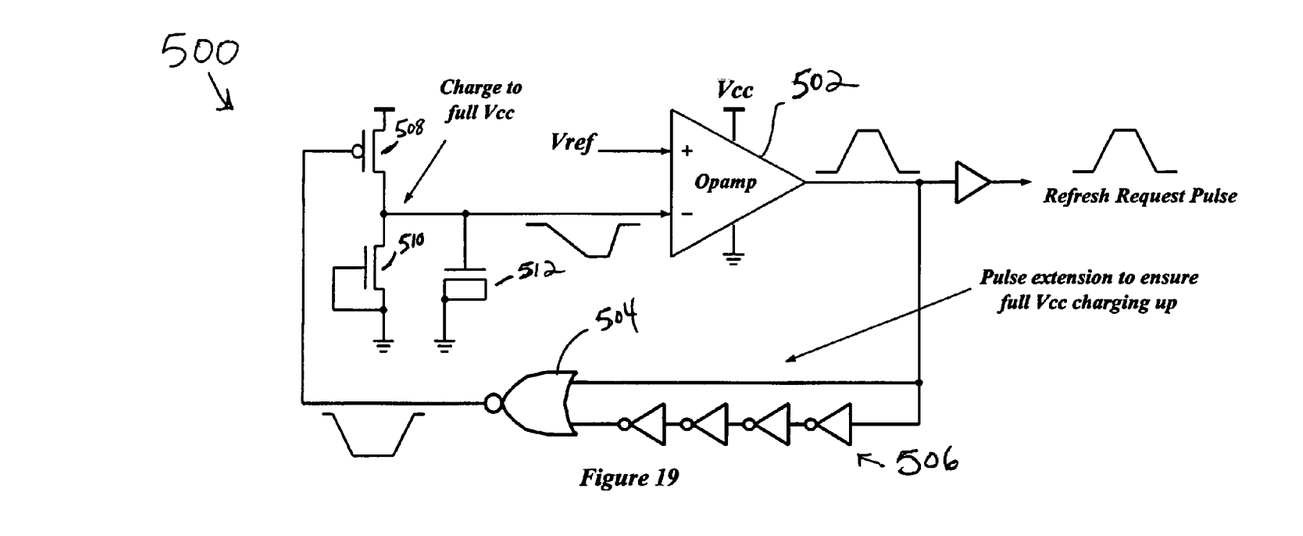
FIG. 19 is a schematic of one embodiment of a refresh timer oscillator, according to the present invention.

FIG. 19 illustrates one embodiment of a refresh timer oscillator 500 that may be used in the present invention. Refresh timer oscillator 500 includes an operational amplifier 502, an exclusive or gate 504, several inverters 506, and transistors 508, 510 and 512. The refresh timer oscillator operates as follows: the opamp 502 compares the voltages at the plus and minus terminals to generate an output pulse, which changes from logic low to logic high and then back to logic low. The pulse is used as the refresh request pulse. The plus terminal of the opamp 502 connects to a reference voltage, Vref, and the minus terminal of the opamp 502 connects to a leakage emulation circuit, transistors 508, 510 and 512. When the voltage at minus terminal of the opamp 502 is discharged to a lower lever than that of Vref at the plus terminal, the output of opamp 502 becomes logic high and subsequently causes NOR gate 504 to output a logic low pulse. With that, the PMOS transistor 508 turns on to charge the minus terminal of the opamp 502. Once the voltage at the minus terminal is higher than that of Vref at the plus terminal, the output of opamp 502 is changed back to logic low and subsequently causes NOR gate 504 to change its output to logic high after some time delay, which is determined by inverters 506. The purpose of this time delay is to ensure the voltage at the minus terminal of opamp 502 is fully charged to logic high. With that, the transistor 508 turns off and the charging of the minus terminal stops. In the meantime, the transistor 510 will continuously discharge the charges stored in the transistor 512 to emulate the memory cell leakage. The time it takes to discharge the charges stored in transistor 512 determines how often to refresh memory cells. The charging and discharging cycle goes on continuously and indefinitely as long as there is power.

In operation, circuit 200 functions like an SRAM memory device. The control logic 224 determines when an active enable pulse is generated based on a read/write enable signal and a clock signal. In one embodiment, the control logic 224 combines external read or write enable signals with an external clock signal to generate a read or write active enable pulse using combinational logic circuitry and a one shot pulse generator. The control logic and pulse generator cooperate to generate only one active enable pulse per cycle. Control logic 224 will not generate an active enable pulse if there is no valid read or write enable signal. The read or write active enable pulse is used to generate the pulse word line for the read or write operation. The address enable pulse activates transistor 226, which transmits the active read/write address to the word line decoder. When the memory device is not performing a normal read/write operation, the SRAM idle pulse combined with the refresh word line pulse cause a refresh address to be transmitted to the word line decoder. The refresh pulse starts a new refresh cycle. The refresh pulse is then synchronized with normal operation to generate refresh enable pulses. In one embodiment, it is possible to utilize refresh enable pulses to do refresh operations. It is not desirable to turn on the refresh word line for the entire duration of the refresh enable pulse because it has an undesired effect of higher power consumption. In order to save power, refresh enable pulses generate refresh word line pulses through one-shot pulse generator 216. The control logic 224 will decide when the refresh address can be sent to the word line decoder, but it is the refresh word line pulse that determines how much time the word line will be active for a refresh. In one embodiment, the refresh word line pulse width is predetermined with worst-case conditions to ensure successful refresh. That is, the refresh pulse is selected to be equal to or wider than the sum of normal operation time plus twice the refresh word line pulse (e.g., refresh pulse≧active enable pulse width+2×refresh word line pulse width).

Figure 14:
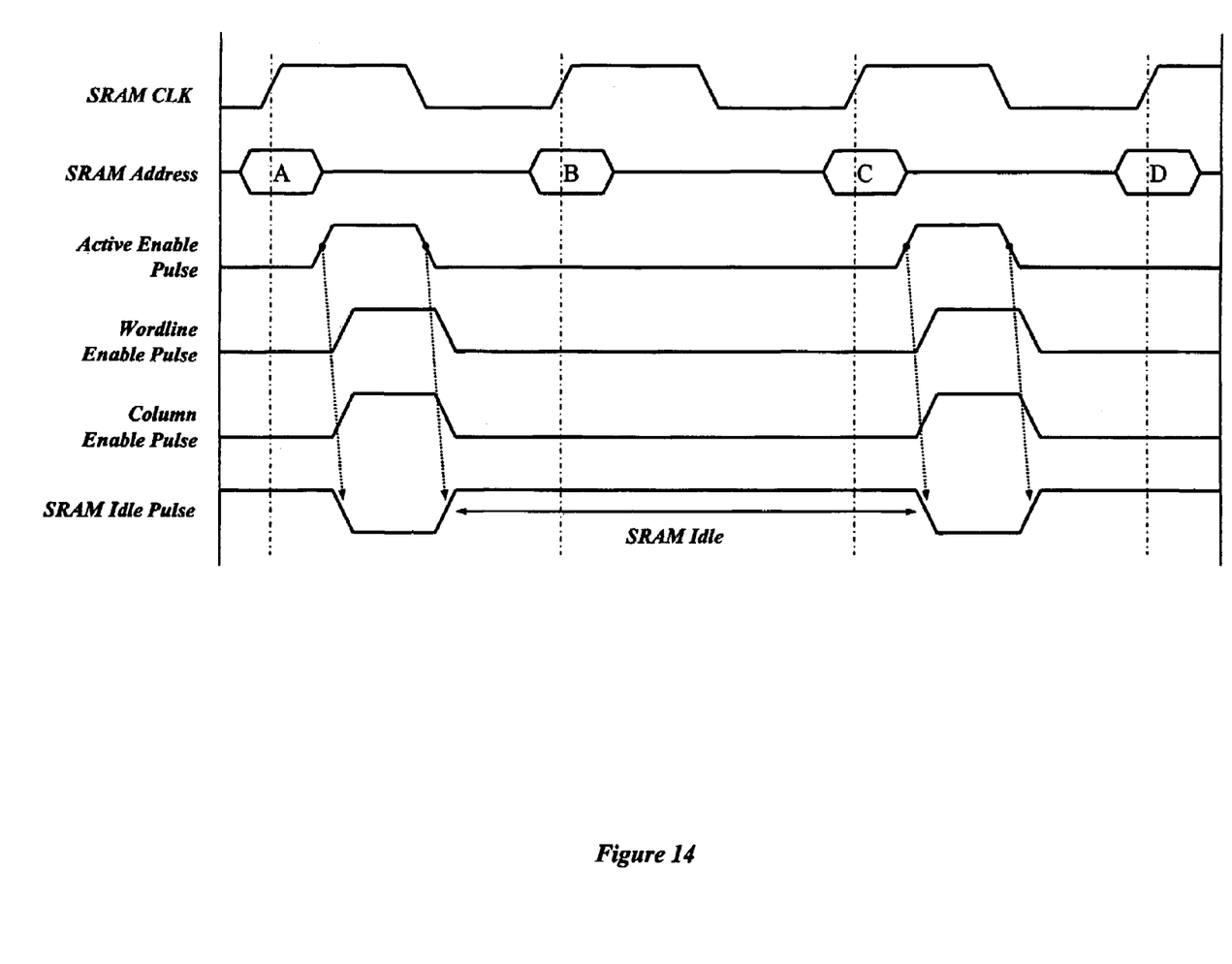
FIG. 14 shows an exemplary simplified SRAM timing diagram for the system shown in FIG. 11.
Figure 15:
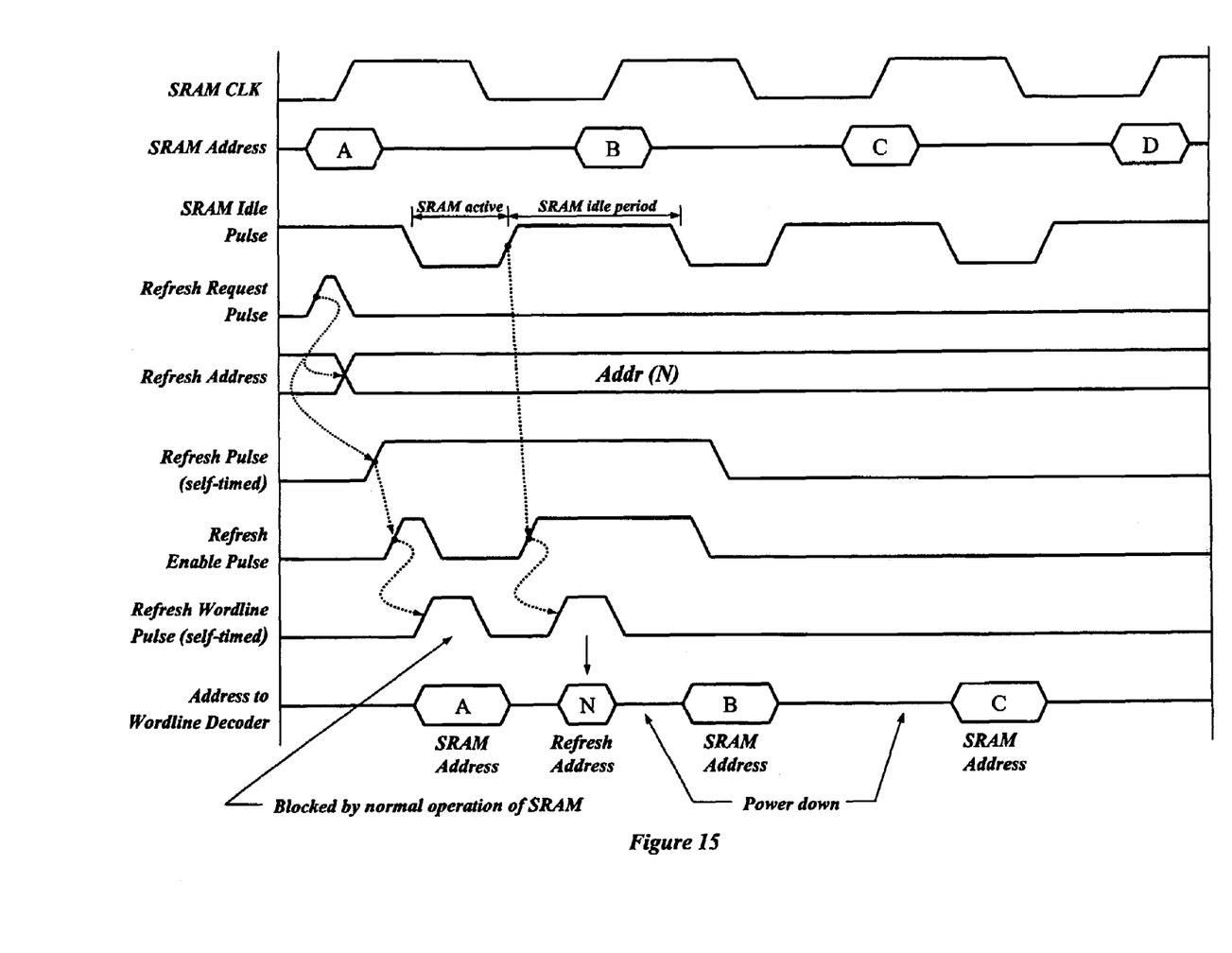
FIG. 15 shows an exemplary of hidden refresh timing diagram for the system shown in FIG. 11 with a short clock cycle.
Figure 17:
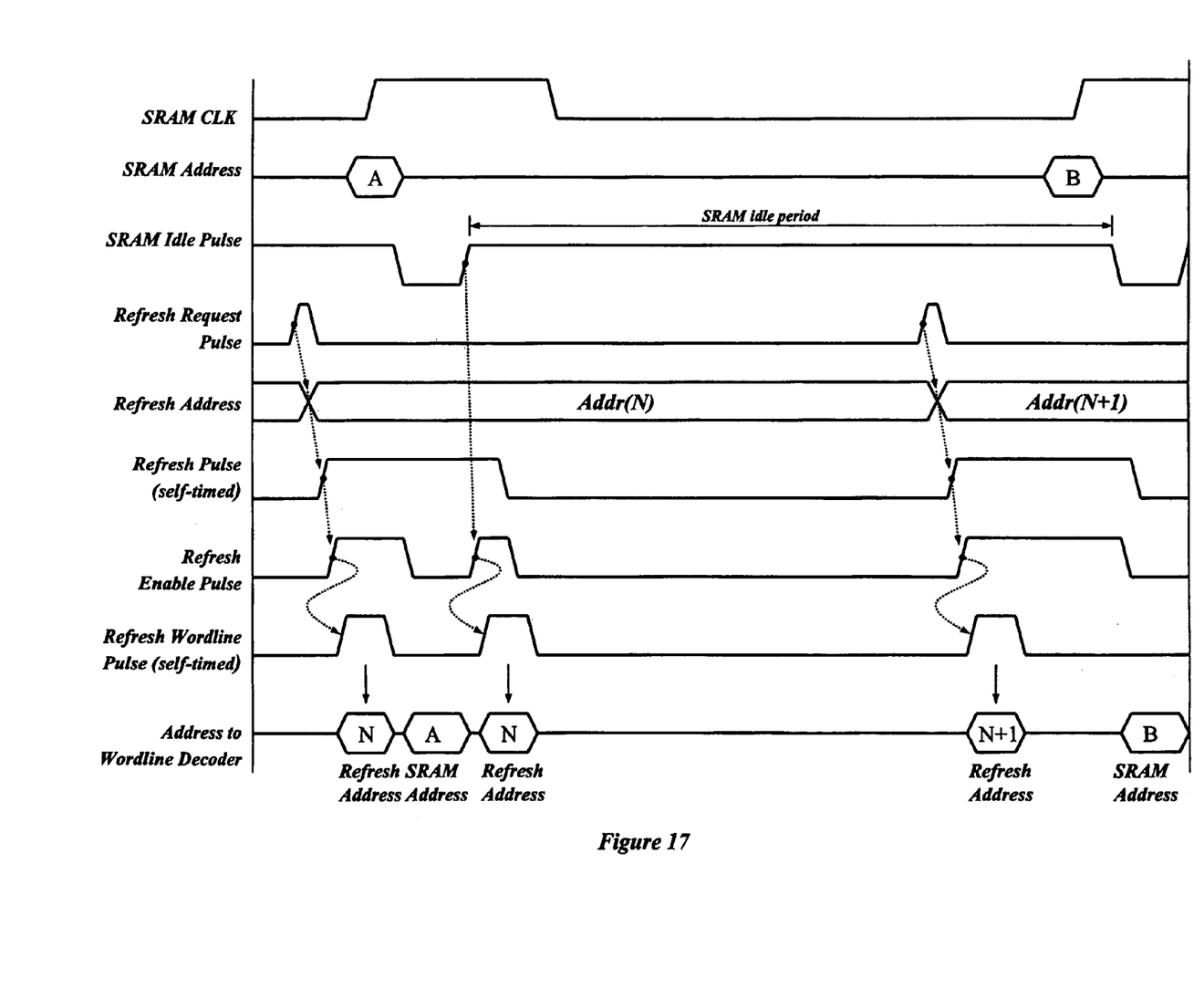
FIG. 17 shows an exemplary hidden refresh timing diagram for the system shown in FIG. 11 with a long clock cycle.
Figure 18:
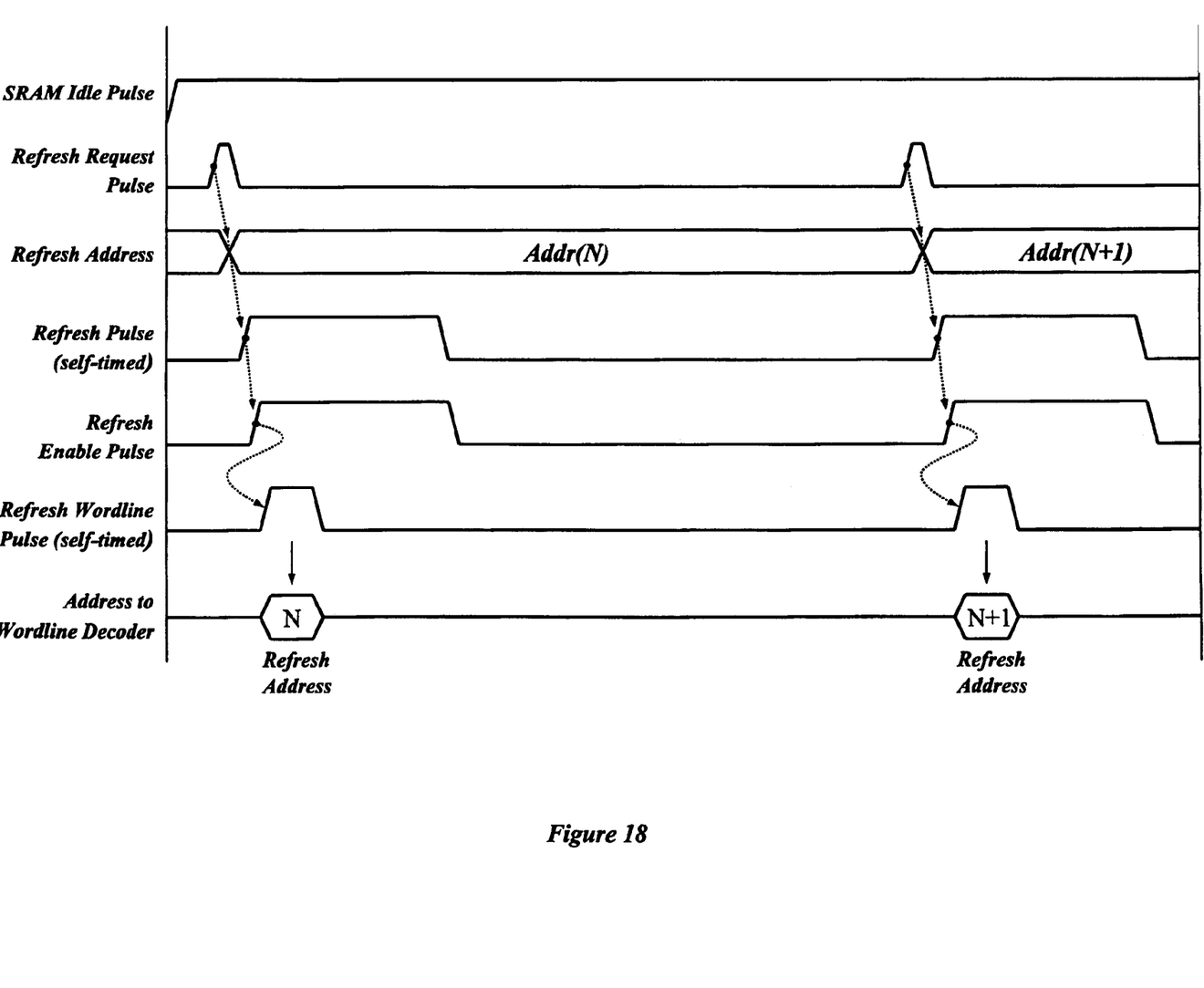
FIG. 18 shows an exemplary hidden refresh timing diagram for the system shown in FIG. 11 with an idle clock.

The exemplary timing diagrams of FIGS. 14, 15, 17 and 18 further illustrate the operation of circuit 200. FIG. 14 shows an example of an SRAM timing scheme that may be employed by the present invention. FIG. 15 is an example of the refresh timing of circuit 200 with a short idle period in which a single refresh is completed (i.e., refresh address N). FIG. 17 is an example of the refresh timing of circuit 200 with a long idle period in which a pair of refresh operations are completed (i.e., refresh addresses N, N+1). FIG. 18 is an example of the refresh operations of circuit 200 during an extended idle period.

FIG. 12 is a schematic diagram of one embodiment of an asynchronous refresh memory circuit 300, according to the present invention. Refresh circuit 300 may include a refresh timer oscillator 302, address counter 304, one shot pulse generators 306 and 316, AND gates 310, 314, inverters 308 and 322, transistors 312, 318, 320 and 328, address transition detectors 324, and OR gate 326. Refresh oscillator 302 is coupled to address counter 304. Address counter 304 is coupled to transistor 312, which may be selectively activated to provide refresh addresses to the DRAM device (e.g., via the word line decoder). Refresh timer 302 is further coupled to one shot pulse generator 306, which is coupled to one of the inputs of AND gate 310. The other input of AND gate 310 is coupled to inverter 308, which is coupled to the output of OR gate 326. The output of AND gate 310 is coupled to one shot pulse generator 316, which is coupled to an input of AND gate 314. The other input of AND gate 314 is coupled to the output of inverter 308, which is also coupled to the gate of transistor 318. The output of AND gate 314 is coupled to the gate of transistor 312 and to the input of inverter 322, which is coupled to the gate of transistor 320.

In this embodiment, an address enable pulse is generated whenever a new address is detected by address transition detectors 324. The address enable pulse activates transistor 328, which transmits the active read/write address to the word line decoder. When the memory device is not performing a normal read/write operation, the SRAM idle pulse combined with the refresh word line pulse cause a refresh address to be transmitted to the word line decoder.

FIG. 13 is a schematic diagram of another embodiment of a synchronous refresh memory circuit 400, according to the present invention. The refresh circuit 400 has a substantially similar design as that of circuit 200 of FIG. 11, with like elements bearing like numerals. The difference between the two designs is that in circuit 400, a refresh flag replaces the refresh pulse of circuit 200. The refresh flag is provided by NAND latch circuit 404, which is connected to refresh timer oscillator 202, via inverter 402, to AND gate 210, and to pulse width detector 406, which is coupled to inverter 222.

Figure 20:
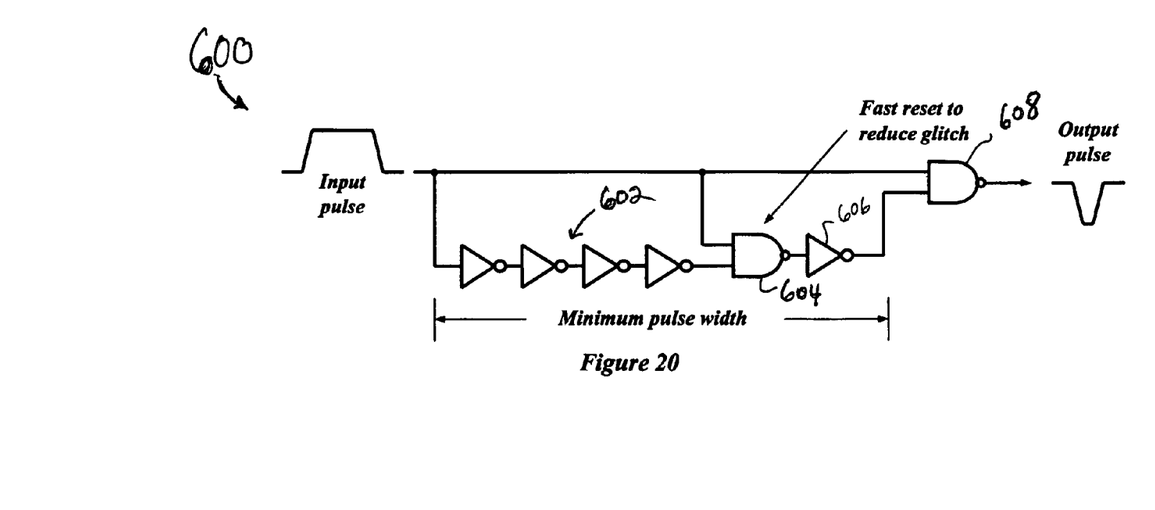
FIG. 20 shows a schematic of one embodiment of a pulse width detector, according to the present invention.

FIG. 20 illustrates one embodiment of a pulse width detector 600 that may be used in the present invention. The pulse width detector 600 includes several inverters 602 that are serially connected together and provide an input to NAND gate 604. One skilled in the art will understand that the number of inverters used will depend on the minimum pulse width that is desired to be detected. Particularly, the more inverters 602 used, the greater the minimum pulse width. The output of pulse width detector 600 (e.g., the output of NAND gate 608), will remain high unless an input pulse is of at least the minimum pulse width. If an input pulse is greater than the minimum pulse width, the pulse width detector 608 will generate an output pulse as shown.

Figure 16:
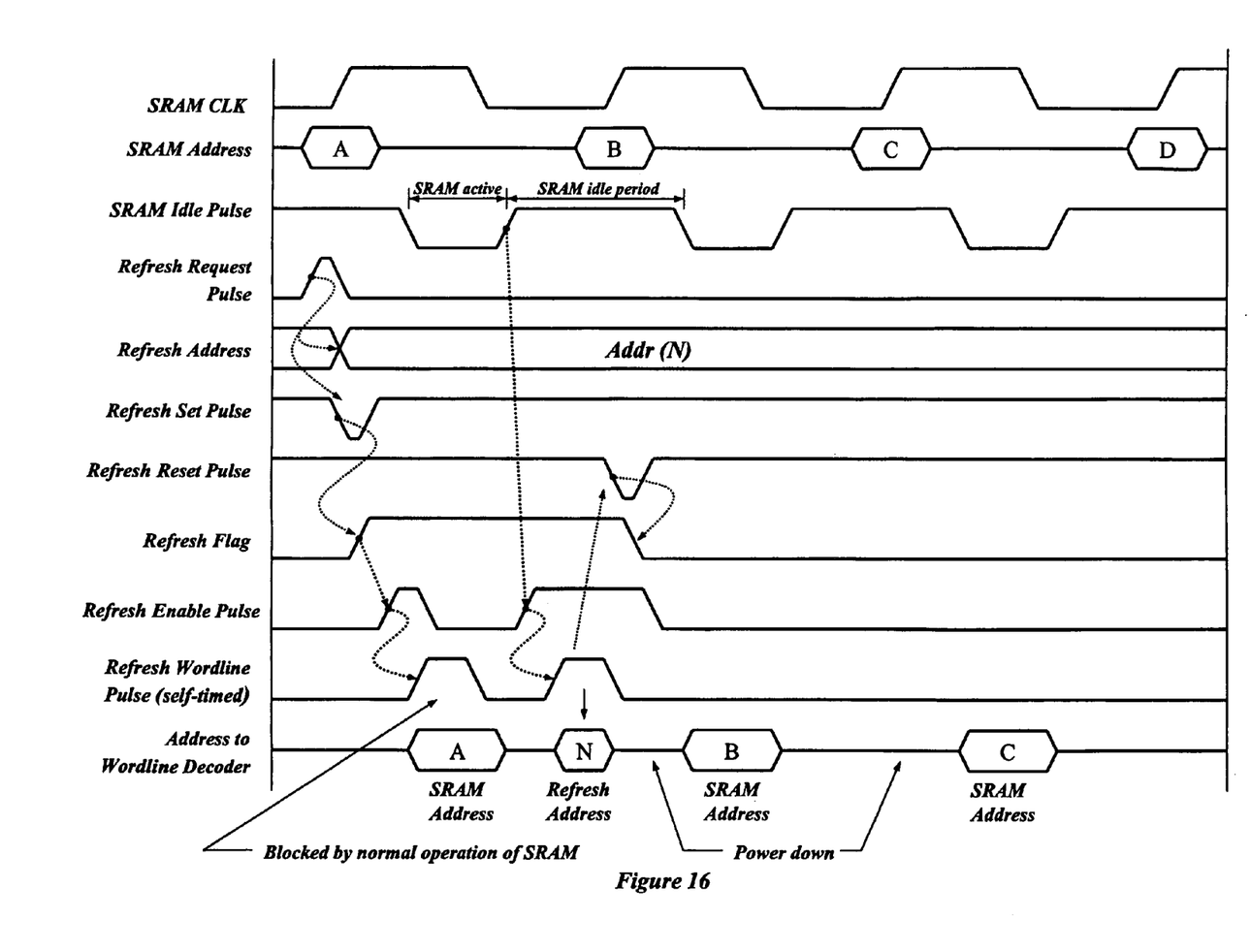
FIG. 16 shows an exemplary hidden refresh timing diagram for the system shown in FIG. 13 with a short clock cycle.

In operation, circuit 400 sets the refresh flag at the beginning of refresh operation and resets the flag when a refresh operation is completed. FIG. 16 is an exemplary timing diagram for circuit 400. The refresh timing of circuit 400 is similar to the timing for circuit 200 of FIG. 11, which is illustrated in FIG. 15.

The present invention may be described as a "hidden self-refresh" because it does not require clock or any other external signals to activate or deactivate the refresh of the DRAM device. The present invention refreshes the DRAM device without interrupting or inhibiting the normal operation of DRAM.

It should be understood that the inventions described herein are provided by way of example only and that numerous changes, alterations, modifications, and substitutions may be made without departing from the spirit and scope of the inventions as delineated within the following claims.

What is claimed is:

1. A system for refreshing a DRAM array, comprising:
   refresh control circuitry that selectively generates requests to perform refresh operations;
   a refresh address counter that is coupled to the refresh control circuitry and that generates a refresh address in response to a request to perform a refresh operation, the refresh address corresponding to a word line of the DRAM array to be refreshed; and
   address control and switching circuitry coupled to the refresh control circuitry, the address control and switching circuitry being adapted to selectively transmit read/write addresses and refresh addresses to the DRAM array to facilitate refreshing of the DRAM array without inhibiting read and write operations;
   wherein the refresh control circuitry comprises:
      a refresh timer oscillator; and
      a pulse generator that is coupled to the refresh timer oscillator and that generates a refresh pulse, which starts a new refresh cycle during which a refresh is capable of being performed;
   wherein the address control and switching circuitry suspends the refresh operations in favor of read and write operations;
   wherein the width of the refresh pulse is longer than a time period required to complete a read or write operation; and
   wherein the width of the refresh pulse is at least as wide as the sum of the time required to complete the read or write operation plus twice the time required to perform a word line refresh.

2. The system of claim 1 wherein the address control and switching circuitry terminates the refresh operations in favor of the read and write operations.

3. The system of claim 1 wherein the address control and switching circuitry is synchronous.

4. The system of claim 3 wherein the address control and switching circuitry generates an active enable pulse that triggers a read or write operation in response to receiving a read/write enable signal.

5. The system of claim 1 wherein the address control and switching circuitry comprises one or more address transition detectors.

6. The system of claim 1 wherein the refresh control circuitry further comprises:
   a latching circuit that is coupled to the refresh timer oscillator and that generates a refresh flag during which time a refresh operation may be completed; and
   a pulse width detector that is coupled to the latching circuit and that selectively causes the latching circuit to reset the refresh flag.

7. The system of claim 1 wherein the address control and switching circuitry selectively transmits addresses to the DRAM array via a predecoder and a word line decoder.

8. The system of claim 1 wherein the address control and switching circuitry selectively transmits addresses to the DRAM array via a word line decoder.

9. The system of claim 1 wherein the address control circuitry selectively transmits addresses to the DRAM array after the addresses have been decoded.

10. A method for refreshing a DRAM array, comprising:
    generating refresh requests;
    generating a refresh address in response to a refresh request, the refresh address corresponding to a word line of the DRAM array to be refreshed; and
    selectively transmitting read/write addresses and refresh addresses to the DRAM array, to facilitate refreshing of the DRAM array without inhibiting read and write operations; and
    generating a refresh pulse, which starts a new refresh cycle during which a refresh may be performed;
    wherein the width of the refresh pulse is longer than a time required to complete a read or write operation; and
    wherein the width of the refresh pulse is at least as wide as the sum of the time required to complete the read or write operation plus twice the time required to perform a word line refresh.

11. The method of claim 10 further comprising:
    terminating refresh operations in favor of the read and write operations.

12. The method of claim 10 wherein addresses are sent to the DRAM array in a synchronous manner.

13. The method of claim 12 further comprising:
generating an active enable pulse that triggers a read or write operation in response to receiving a read/write enable signal.

14. The method of claim 10 wherein the addresses are transmitted to the DRAM array via a predecoder and a word line decoder.

15. The method of claim 10 wherein addresses are transmitted to the DRAM array via a word line decoder.

16. The method of claim 10 wherein addresses are transmitted to the DRAM array after the addresses have been decoded.

17. The system of claim 9 wherein the address control and switching circuitry terminates the refresh operations in favor of the read and write operations.

18. The system of claim 9 wherein the address control and switching circuitry is synchronous.

19. The system of claim 18 wherein the address control and switching circuitry generates an active enable pulse that triggers a read or write operation in response to receiving a read/write enable signal.

20. The system of claim 3 wherein the address control circuitry selectively transmits addresses to the DRAM array after the addresses have been decoded.

21. The method of claim 10 further comprising:
generating an active enable pulse that triggers a read or write operation in response to receiving a read/write enable signal.

22. The system of claim 1, wherein the address control and switching circuitry is asynchronous.

23. The method of claim 11, wherein addresses are sent to the DRAM array in an asynchronous manner.

24. The method of claim 23, wherein the address control circuitry comprises one or more address transition detectors.

* * * * *